United States Patent
Porter et al.

[11] Patent Number: 6,046,546
[45] Date of Patent: Apr. 4, 2000

[54] STABILIZER FOR SWITCH-MODE POWERED RF PLASMA

[75] Inventors: Robert M. Porter, Fort Collins; Michael L. Mueller, Loveland, both of Colo.

[73] Assignee: Advanced Energy Industries, Inc., Fort Collins, Colo.

[21] Appl. No.: 09/072,613

[22] Filed: May 5, 1998

Related U.S. Application Data

[63] Continuation of application No. 08/318,777, filed as application No. PCT/US93/03543, Apr. 15, 1993, Pat. No. 5,747,935, which is a continuation of application No. 07/869,794, Apr. 16, 1992, abandoned.

[51] Int. Cl.[7] .................................................. H01J 7/24
[52] U.S. Cl. ........................ 315/111.21; 315/111.51; 315/111.71
[58] Field of Search .................... 315/111.21, 111.51, 315/111.71

[56] References Cited

U.S. PATENT DOCUMENTS

| | | | |
|---|---|---|---|
| 3,347,698 | 10/1967 | Ingham, Jr. | 315/111.21 |
| 3,445,782 | 5/1969 | Sonkin | 330/124 R |
| 3,492,074 | 1/1970 | Rendina | 315/111.21 |
| 3,569,846 | 3/1971 | Matsuura | 329/140 |
| 4,375,051 | 2/1983 | Theall | 333/17 |
| 4,383,203 | 5/1983 | Stanley | 315/248 |
| 4,590,436 | 5/1986 | Butler et al. | 330/295 X |
| 4,590,437 | 5/1986 | Butler et al. | 330/295 X |
| 4,629,940 | 12/1986 | Gagne et al. | 315/111.51 |
| 4,631,493 | 12/1986 | Vendelin et al. | 330/295 X |
| 4,679,007 | 7/1987 | Reese et al. | 333/17 |
| 4,795,880 | 1/1989 | Hayes et al. | 315/111.51 |
| 4,877,999 | 10/1989 | Knapp et al. | 315/248 |

(List continued on next page.)

FOREIGN PATENT DOCUMENTS

| | | | |
|---|---|---|---|
| 0421430 | 4/1991 | European Pat. Off. | H01J 37/32 |
| 0553410-A1 | 8/1993 | European Pat. Off. | C23C 14/35 |
| 0 564 789 A1 | 10/1993 | European Pat. Off. | C23C 14/54 |
| 3121389-A1 | 8/1982 | Germany | C23C 15/00 |
| 4113704-A1 | 10/1992 | Germany | C23C 14/34 |
| 61-030-665 | 2/1986 | Japan | C23C 14/34 |
| 1-14312 | 3/1989 | Japan . | |

OTHER PUBLICATIONS

Fivash, M., "Dissipative Filters," Oct. 1988, RF Design, pp. 73–83.

Cuthbert, T., "Circuit Design Using Personal Computers," 1983, John Wiley and Sons, Inc., pp. 377–383.

Shuch, H. "Interstage 50–OHM Terminator For VHF Converters," Feb. 1988, Ham Radio, pp. 14, 908–9.

Motorola Applications Notes AN215A; Roy Hejhall; 1990; Motorola RF Device Data, vol. II, #DL110 rev 4, pp. 7–17 to 7–28.

J. Launchner & M. Silverstein; Linvill Technique Speeds High Frequency Amplifier Design; Apr. 12, 1966; Electronic Design, pp 48 to 54.

Stability and Power Gain of Tuned Transistor Amplifiers; A. Stern; Mar., 1957; Proceedings of the IRE; pp. 335 to 343.

*Primary Examiner*—Michael B Shingleton
*Attorney, Agent, or Firm*—Santangelo Law Offices, P.C.

[57] ABSTRACT

Circuitry and techniques designed to allow stable and continuous delivery of alternating power to a plasma with switch-mode power supply (16) include a variety of embodiments. Parallel, series, and other circuit elements connected across switching element (7) are tuned so that energy at other than the fundamental frequency is absorbed and dissipated. This energy may be only at the second harmonic or it may be across broad frequency ranges through selecting high impedance at the fundamental frequency and relatively low impedance at other frequencies. In overcoming instabilities, oscillations, and even changing class of operation of the switch-mode power supply, the stabilizing element absorbs the energy to avoid allowing it to affect switch (7) of power supply (16).

49 Claims, 5 Drawing Sheets

U.S. PATENT DOCUMENTS

| | | | |
|---|---|---|---|
| 4,980,810 | 12/1990 | McClanahan et al. | 363/16 |
| 5,077,498 | 12/1991 | Oku | 315/111.21 |
| 5,118,997 | 6/1992 | El-Hamamsy | 330/251 X |
| 5,121,084 | 6/1992 | Anderson et al. | 330/295 |
| 5,146,137 | 9/1992 | Gesche et al. | 315/111.51 |
| 5,187,457 | 2/1993 | Chawla et al. | 333/170 |
| 5,187,580 | 2/1993 | Porter, Jr. et al. | 330/207 A |
| 5,189,601 | 2/1993 | Sellers | 363/21 |
| 5,200,672 | 4/1993 | Sheynberg et al. | 315/248 |
| 5,306,986 | 4/1994 | Siao | 330/251 X |

STABILIZER FOR SWITCH-MODE POWERED RF PLASMA

This is a continuation of application Ser. No. 08/318,777, filed Oct. 14, 1994, now issued as U.S. Pat. No. 5,747,935, which is a national application of a PCT application, PCT/US93/03543, filed Apr. 15, 1993, which itself is a continuation of U.S. Ser. No. 507/869,794, filed Apr. 16, 1992, now abandoned.

I. TECHNICAL FIELD

The present invention relates generally to the delivery of power through an alternating current to a processing plasma such as is used in thin film processing. Specifically, the invention focuses upon overcoming the occurrence of oscillations and instabilities often encountered when power is supplied by a switch-mode power supply.

II. BACKGROUND ART

The technique of material processing through the utilization of plasmas has been known for many years. In one application, it may involve the production of thin films on a surface through the action of the plasma, while in another it may involve the etching of those same films, also through the action of the plasma. In recent years the commercial demand for the equipment involved has increased significantly as its application to the creation of microchips and other semiconducting devices has been refined. Basically the technique involves the ignition and maintenance of a processing plasma through the application of electric power to the plasma. The plasma then interacts with gases introduced and the surfaces involved to effect the processing desired.

A potentially important characteristic of the field involved is that this field has evolved with a primary focus upon the plasma itself, not the circuitry involved. Although those skilled in the art have long desired certain refinements in electrical circuitry and capabilities, the suppliers of AC power generation equipment and handling equipment for plasma processing have generally applied techniques long known in the communication field, without always recognizing the differences between the nonlinear plasma load and the linear antenna (the usual load for communications equipment). While plasma-oriented physicists and chemists have greatly expanded the understanding of the processes involved, advancements with respect to the alternating power supplied and the circuits involved have not occurred to the same degree.

As those skilled in the art have come to understand, the nature of the processing plasmas being utilized does not easily lend itself to modeling as a simple circuit element in an AC circuit. Rather, with even detailed circuit knowledge, the inclusion of a plasma in an AC circuit is inherently difficult. This is because in most processing environments the plasma acts not just as an active element—that is, one whose characteristics depend upon other system parameters such as gas pressure and temperature—out it also acts as a highly nonlinear and dynamic element. As a nonlinear element, the plasma changes its electrical characteristics depending upon the power applied to it in a discrete fashion throughout the range of operations and environments. Naturally, when the plasma is quenched, the chamber may have high impedance; when ignited, it may have low impedance. However, the class also varies highly even while it is ignited. This effect is particularly acute in instances where alternating power is utilized because vast variations in the character of the plasma can occur even over one cycle of the alternating power, voltage, or current. The plasma's nonlinear character has made traditional circuit analyses extremely difficult and has made understanding instabilities and oscillations more difficult. As a dynamic element, the plasma can change its character over even one cycle of power. Again, this makes understanding problems encountered more difficult. These difficulties are compounded when switch-mode power supplies are used. Wile alternating power generators have been used for many years to excite a plasma, the desire to utilize solid state, switch-mode generators for reliability and smaller size has resulted in certain new problems.

The highly variable nature of the plasma can often lead to characteristics which are not conducive to stable, continuous operation. This problem is particularly acute in situations where switch-mode power supplies are utilized. In such instances, it is not uncommon for the supply of alternating power to be suddenly and inexplicably interrupted or to be altered in some fashion. These conditions may exist until operator intervention or in some instances they may also suddenly and inexplicably cease to exist on their own. Until the present invention, the exact cause of these conditions was not understood. Rather, those skilled in the art merely assure that it was incidental by involvement with the plasma due to its highly variable nature. Those skilled in the art were however able to identify that the effects seemed to manifest themselves in two different ways. First, oscillation of the switch-mode power supply might occur. Second, the waveform of the power supply might be affected such that efficiency would drop. This could even occur to the extent that a different class of operation might result. Perhaps as a result of the latter of these two manifestations, the response by those skilled in the art was to overcome the problem by avoiding switch-mode power supplies altogether. By utilizing power supplies operating in a nonswitch-mode class (typically Class B operation), it was understood that these effects would largely be avoided. This was especially true for relatively inefficient power amplifiers because impedance changes in the plasma would thus represent a relatively lower percentage change to the entire system.

Prior to the present invention, however, no solution which reliably overcame these instability effects existed for systems utilizing switch-mode power supplies. Even though the art of stabilizing power supplies in general is well known to encompasses theories originally advanced by Linvill and Stern, these approaches did not appropriately apply to plasma systems using switch-mode amplifiers. These approaches are premised upon linear elements and are generally applied to broadband amplifiers. The application of the present invention involves not only nonlinear elements, but it also presents a narrowband system, thus efforts to solve the problems encountered using traditional stability theories have not been successful. While those skilled in the art had long expressed a need to overcome these problems for switch-mode power supply applications, the solutions implemented actually taught away from the desired direction in that they avoided the use of the relatively high efficient, switch-mode power supplies in the first place. As the present invention discloses, efforts by those skilled in the art were inadequate because they failed to understand the problem thoroughly enough to implement a solution. This is poignantly shown by the relatively simple nature of the present invention and the unexpectedly simple implementation which has proven to overcome the problems. Until the present invention, however, these similar solutions were not available to those skilled in the art.

III. DISCLOSURE OF INVENTION

Accordingly, the present invention provides a technique whereby instabilities can be largely avoided in a processing plasma system while still utilizing a switch-mode power supply. The system involves the inclusion of circuit elements which act to absorb energy at other than the fundamental frequency of operation to avoid any effects by these frequencies upon the primary switching element of the switch-mode power supply. Different embodiments are disclosed which achieve this absorption at different points in the system. Additionally, multiple elements are disclosed in order to accommodate particularly troublesome applications. The utilization of these circuit elements and techniques are disclosed in combination with a number of switch-mode classes of operation, particularly Class D operation, Class E operation, and even the relatively new operation disclosed in U.S. Pat. No. 5187580, which is being referred to as Class AE operation.

Thus it is an object of the present invention to avoid instabilities in the supply of alternating power to processing plasma when using switch-mode power supplies. In keeping with this general object a goal is to overcome effects causing oscillations in the supply of power. Likewise, a goal is to also avoid any effects which cause inefficiencies or any change in class of operation of the power amplifier being utilized. Thus a goal of the solutions proposed is to absorb only those energies which cause undesirable effects in the processing system.

Another general object of the present invention is to provide a practical solution to the problems encountered. In keeping with this general object a goal is to disclose simple solutions which may be easily implemented in either the power supplies involved or in existing systems.

Yet another object is to address as broad a range of problems as possible. Thus a goal is to disclose a variety of variations in implementation so that these variations can be chosen based upon the particular processing environments involved. A goal is to allow for different designs so that absorption and solutions can be effected at only those frequencies encountered in a particular application if desired. Thus the goal of maintaining the highest degree of efficiency is also achieved. Similarly a goal is to provide for the possibility of multiple absorptions for particularly troublesome applications. Another goal is to achieve the greatest degree of variability by providing for phase chances in between the absorbing elements in order to assure the achievement of solutions in a variety of applications.

Another object of the present invention is to provide elements which can easily be implemented in a variety of classes of operation. Thus, the goal of achieving the solution which works for Class D, Class E, and Class AE power amplifiers is achieved.

Naturally, further objects of the invention are disclosed throughout other areas of the specification and claims.

V. BEST MODE FOR CARRYING OUT THE INVENTION

Figure 1:
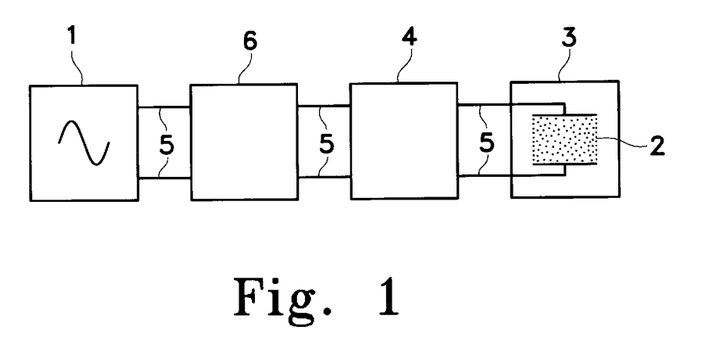
FIG. 1 is a schematic diagram of a plasma processing system incorporating the present invention on the transmission line.
Figure 2:
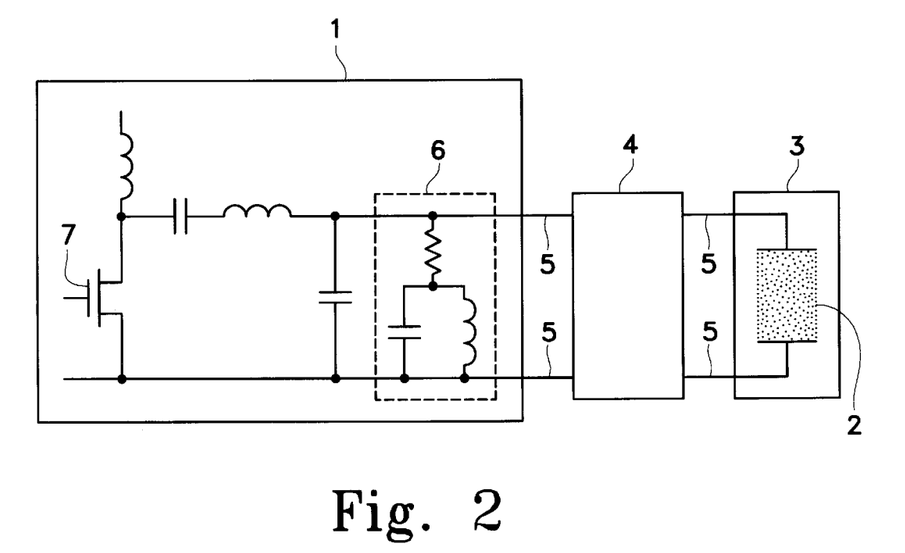
FIG. 2a is a schematic diagram of another embodiment showing the present invention incorporated within a Class AE switch-mode power supply.
FIG. 2b is an embodiment including circuitry representative of a Class E amplifier.
FIG. 2c is an embodiment including circuitry representative of a Class D amplifier.
FIG. 2d is an embodiment including circuitry representative of a Class C amplifier.

As can be seen from the drawings, the basic concepts of the present invention may be embodied in a variety of ways. While particular embodiments of the invention will be described, it will be obvious that changes and modifications may be made without departing from the broad aspects of the present invention. Referring to FIG. 1 it can be seen how the present invention can be easily incorporated into a typical plasma processing system. FIG. 1, a schematic of a plasma processing system with an embodiment of the present invention included, illustrates both details with respect to plasma processing in general and the present invention.

As shown, a plasma processing system as involved with the present invention involves switch-mode power supply (1) which generates some alternating signal (typically sinusoidal voltage and current waveforms) to power processing plasma (2). This alternating signal is conditioned to operate at a single fundamental frequency. In this field, usually switch-mode power supply (1) coerates at a fundamental frequency in the high frequency band at 13.56, 27.12, or 40.68 megahertz due to certain regulatory requirements. It should be understood, however, that the fundamental principles taught by the invention are not significantly dependent upon the fundamental frequency of switch-mode power supply (1).

Until now one type of solid state generator has been predominately used to drive plasma loads. It features a Class B push-pull output amplifier stage. It has been the most satisfactory type of amplifier stage due to certain aspects of the output stage and its relative inefficiency. The maximum output efficiency of such an amplifier is about 60%. The power lost in the output stage has a beneficial effect of making it possible to stabilize the amplifier when it is subjected to the two problems just mentioned. Many variables exist but, in general, the more efficient an amplifier is, the more unstable it will be under unmatched loads or into a highly non-linear load. The present invention overcomes this limitation. This stabilizer allows switch-mode type amplifiers to attain 90% efficiency. This difference makes it possible to make substantial reductions in the size, weight and cost of a RF generator used for plasma excitation.

As mentioned, switch-mode power supply (1) generates an alternating signal which is directed to processing plasma (2) through some transmission line. This transmission line may be coaxial cable or simply a two lead transmission line (5). In order to maintain conditions appropriate for processing plasma (2), processing plasma (2) is contained within processing chamber (3) within which pressure, constituency, and other parameters can be controlled. One of the difficulties in maintaining a constant power transmission level into processing plasma (2) is the large variation in impedance in processing plasma (2). Typically, before processing plasma (2) is ignited, it characteristically has very high impedance. Once ignited, the impedance of processing plasma (2) tends to discretely reduce. Even during processing, the impedance of processing plasma (2) varies based upon power, voltage, current, pressure, gas type and other variables. These inherent variations, and the fact that switch-mode power supply (1) is typically designed to operate optimally for a particular impedance load of 50 ohms, have lead those skilled in the art to include matching network (4) to interactively coordinate the circuit as appropriate for switch-mode poor supply (1) and the load experienced by it.

As shown schematically in FIG. 1, in one embodiment the present invention may be stabilizing element (6) inserted at some point on transmission line (5). As can be easily understood, stabilizing element (6) may be located at a variety of places so long as it achieves the goal of absorbing the undesirable energy to avoid allowing it to cause the mentioned effects. For additional stability, a stabilizer may be placed before and after a harmonic filter as discussed later. This arrangement provides additional stability as one stabilizer works for some untuned loads and the other stabilizer works for others. The phase shift of the filter and the load angle of the untuned load determines which stabilizer will have the most effect.

As mentioned earlier processing plasma (2) is highly non-linear. This means the instantaneous impedance of processing plasma (2) may change continuously during each alternating signal. It consequently generates harmonics of the fundamental frequency. These harmonics may propagate towards switch-mode power supply (1) where they can change the instantaneous load impedance, change the class of operation, or cause the amplifier to oscillate. Additionally, the dynamic nature of processing plasma (2) can cause instances when matching network (4) is unable to provide a proper load to switch-mode power supply (1). This mismatch often occurs after switch-mode power supply (1) is turned on but before processing plasma (2) is ignited. There are also constant changes in the nature of processing plasma (2) which matching network cannot accommodate instantaneously. The resultant load presented to switch-mode power supply (1) can be anywhere on the Smith chart and even have VSWR's as high as 30 to 1 or 50 to 1. This type of load can cause undesired operation by switch-mode power supply (1). While a variety of techniques of stabilizing switch-mode power supplies have existed, generally these techniques are not appropriate for switch-mode power supplies operating in conjunction with a processing plasma. They typically are applied to linear power amplifiers such as Class A and Class B amplifiers. Class D, E, and AE amplifiers are not only non-linear, but they do not exhibit any active region during a typical cycle. These amplifiers use switching elements which are biased alternatively in the saturation (or conductive) state and the cut off(or non-conductive) state. As mentioned, stability theory as it has been applied to the present invention has been useful in stabilizing linear amplifiers only. This stability theory has not applied to the more efficient, Class D, E, and AE amplifiers as the approaches generally make use of controlling a device in the active region. Linear amplifiers by definition have voltage across the active devices while current is flowing in them. This represents power lost in the device. The so-called Class A configuration ha s power lost nearly uniformly at every point in the cycle, while Class B circuits have varying amounts of power lost during the cycle, but both have sufficient loss at all times to make stabilization either unnecessary or easy. The small portion of the cycle wherein the devices do conduct with voltage across them represents sufficient loss to make them stable with at least some range of load and source impedances, however, and exploitation of this loss permits broader stabilization with appropriate feedback.

The newer Classes D, E, and AE use switching elements as opposed to linear elements. The circuit is arranged to permit no voltage across the switch when it is in conduction and no current through it when it is not. That is, the device is permitted to take only two states: fully conductive and fully non-conductive. This means, to first order, that no power is dissipated in the switch. Classical stability theory does not apply to such a circuit, since the classical approaches make use of controlling the devices when they are in a linear region of operation. Similarly, for certain conditions, Class C circuits can be viewed as an equivalent of the Class E or AE systems and can be considered switch-mode amplifiers. Specifically, when the Class C circuit is operated so as to have a relatively short active region for the primary switch element, these circuits might be considered to operate in a switch-mode fashion for purposes of the present invention. Thus the techniques of the present invention might also benefit Class C circuits in such instances. Naturally, other circuit variations are possible as well so long as the essence of absorbing undesired energy which may affect the primary switching element.

As mentioned earlier, the character of processing plasma (2) may cause harmonics of the fundamental frequency which can affect the operation of switch-mode power supply (1). This simile realization has lead the inventors to the solution of merely including stabilizing element (6) at some point within the entire system so that the energy contained in these harmonic frequencies can be absorbed or otherwise deflected to avoid allowing this energy to affect the operation of switch-mode power supply. Thus stabilizing element (6) serves as a an energy absorption element.

Figure 3:
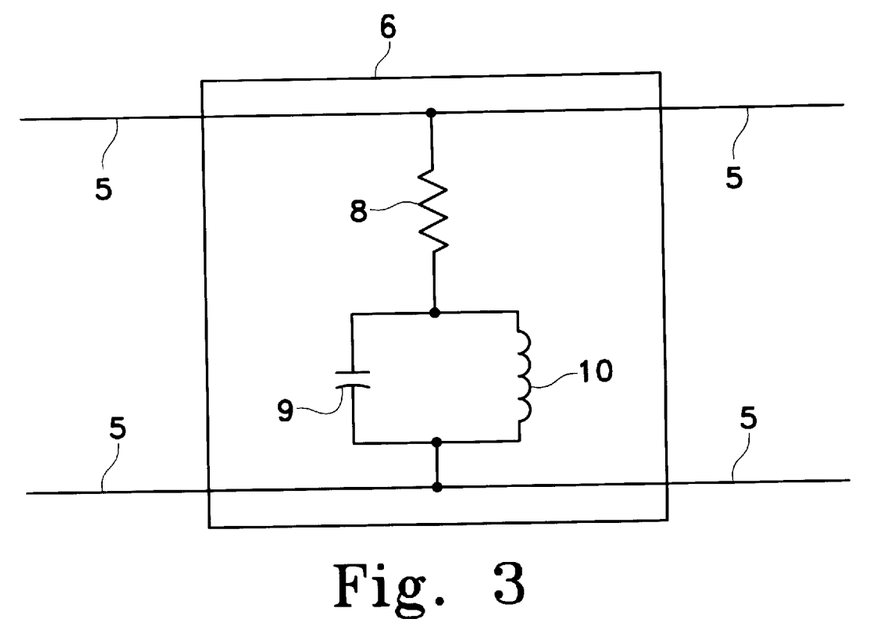
FIG. 3 is a circuit diagram of a parallel element embodiment showing the element on the transmission line.

Referring to FIGS. 2a–d various schematic diagram of another embodiments, it can be seen that stabilizing element (6) may be actually placed within switch-mode power supply (1) (such as the Class AE, E, D, and C power supplies shown) on transmission line (5). As is well understood by those skilled in the art, switch-mode power supply (1) involves one or more primary switching elements (7). This element (often a field effect or bipolar transistor) switches the fundamental frequency in order to generate alternating the alternating signal. Since the switching of primary switching element (7) can be affected by energy propagated back to it, stabilizing element (6) shown within switch-mode power supply (1) acts to absorb this energy and thus avoid effects upon primary switching element (7). With this simple conceptual understanding, it has been discovered that each of the undesirable manifestations of instability are avoided to a large degree. Oscillations in the operation of switch-mode power supply (1) no longer occur and effects upon the waveform generated by switch-mode power supply (1) are largely avoided. Importantly, stabilizing element (6) acts to affirmatively and substantially absorb the undesired energy. Thus while virtually every circuit has elements which inherently absorb energy at a variety of frequencies, the present invention does this intentionally into a degree sufficient to avoid the undesired effects upon switch-mode power supply (1). Stabilizing element (6) will also affirmatively dissipate the energy which has been absorbed. Referring to FIG. 3 the electrical circuity of a parallel element embodiment can be easily understood. As shown, transmission line (5) has inserted on it stabilizing element (6). This parallel circuit is connected between the two conducting elements of transmission line (5). Stabilizing element (6) contains resistor (8), capacitor (9) and inductor (10) connected as shown between the two leads of transmission line (5). In this fashion, stabilizing element (6) accomplishes absorption of the undesired energy on the with transmission line. Importantly, the values of resistor (8), capacitor (9), and inductor (10) are selected so that stabilizing element (6) acts as a tuned circuit element. As such the element is resonant at the fundamental frequency of switch-mode power supply (1). That is, the "Q" of stabilizing element (6) is chosen such that the impedance at the fundamental frequency is which enough (for a parallel embodiment as discussed later) to cause insignificant losses at the fundamental frequency. Conversely, for a parallel embodiment, the impedance of stabilizing element (6) is low at the undesired frequencies. As a result the resistor loads these frequencies and acts as some means for dissipating the energy to avoid it having any significant effect upon primary switching element (7) thus, the term "absorb" includes the dissipation of energy. Again this may be done affirmatively through circuit design. Likewise the entire element would also cause absorption of the energy generated by an amplifier oscillating at a frequency other than the fundamental frequency and thus serve to dampen the power generated thus preventing the undesired oscillation. In the case of a plasma load causing harmonics to propagate toward the generator, the parallel resonant circuit will be a low impedance at these frequencies. Therefore the resistor loads these harmonics, keeping them from having much effect on the amplifier.

Figure 4:
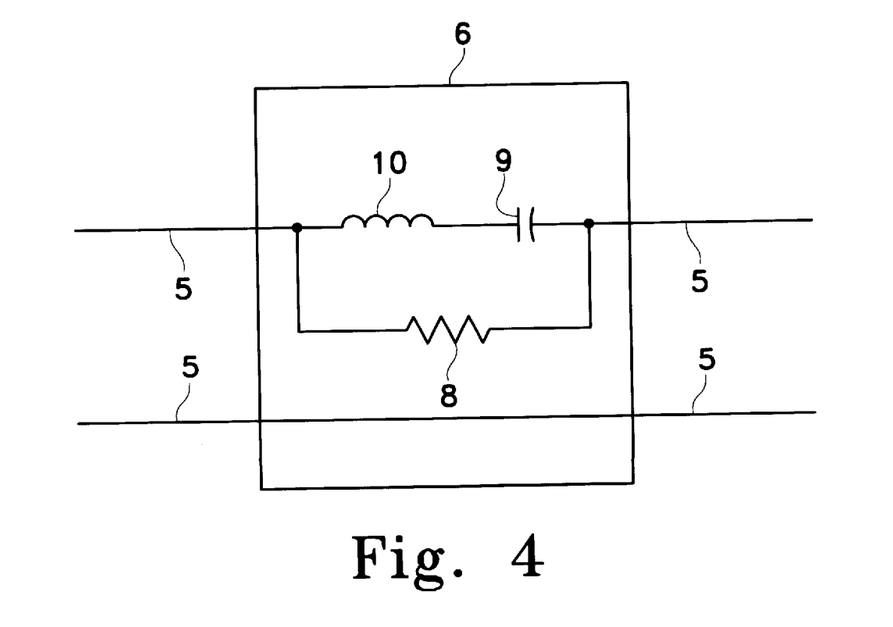
FIG. 4 is a circuit diagram of a series element embodiment showing the element on the transmission line.

Referring to FIG. 4, it can be seen that stabilizing element (6) may also be embodied in a series element embodiment. As shown in FIG. 4, the series element embodiment likewise consists of resistor (8), capacitor (9), and inductor (10), however, in this case they are connected in a series type connection as shown. As those skilled in the art would readily understand, for a series embodiment, the impedance of stabilizing element (6) would be roughly the opposite of that for a parallel embodiment. Specifically, the values of resistor (8), capacitor (9), and inductor (10) should be selected in such a fashion that stabilizing element (6) would effectively have low impedance at the fundamental frequency, but high impedance at the undesired frequencies. As can be easily understood, these undesired frequencies may be one specific frequency such as the second harmonic frequency (usually the frequency containing the next significant amount of energy) or it may be that stabilizing element (6) presents low impedance at all frequencies other than the fundamental. In order to achieve these goals across a large band of frequencies, it is even possible to include multiple stabilizing element (6) as discussed later.

Figure 5:
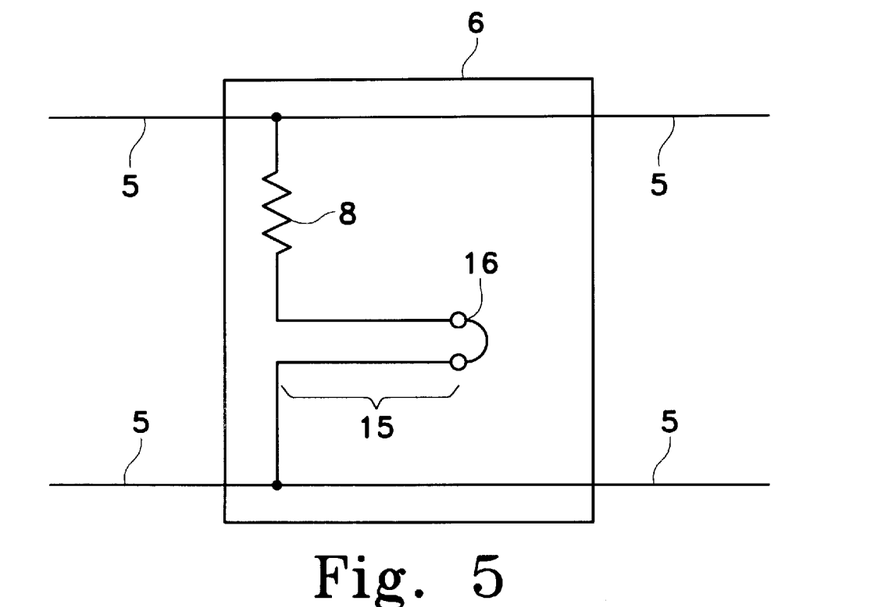
FIG. 5 is a circuit diagram of a parallel element embodiment showing the utilization of a specific length of transmission line.
Figure 6:
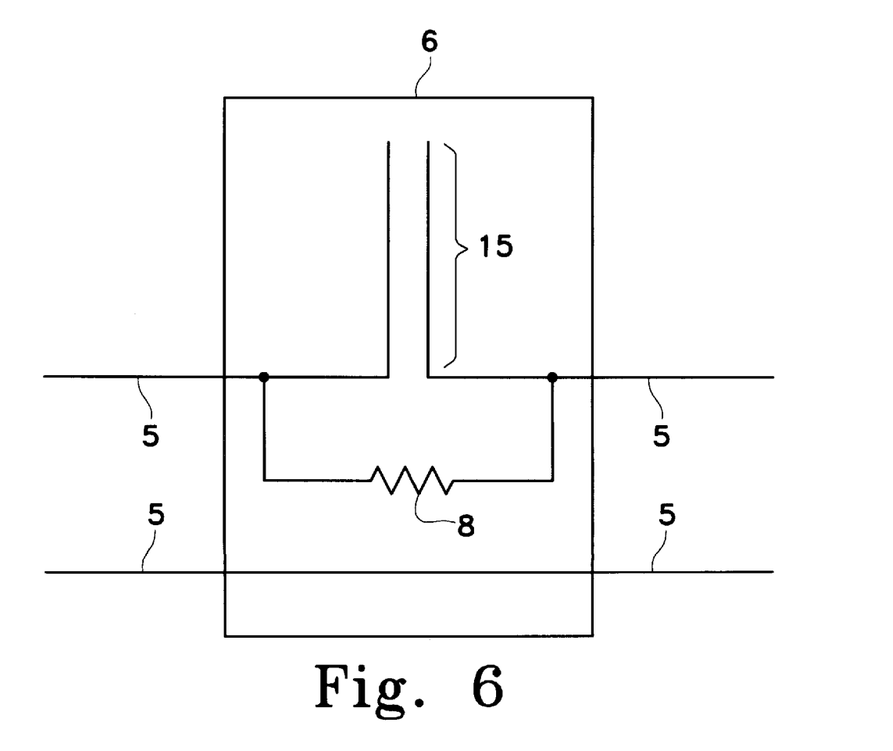
FIG. 6 is a circuit diagram of a series element embodiment showing the utilization of a specific length of transmission line.

Referring to FIGS. 5 and 6 it can be understood that stabilizing element (6) may also be achieved through utilization of a resistor and some connection with a specific length (15) of a transmission line. As shown in FIG. 5, this transmission line could be simply a resistor in series with a specific length (15) of twin lead wire or coaxial cable connected together at one end by end connection (16). This would constitute a parallel element for which impedance would be relatively high at the fundamental frequency. Likewise as shown in FIG. 6, a series element could be accomplished. As shown in FIG. 6, the specific length (15) of transmission line (again either twin lead or coaxial cable) has a resistor connected across it and is not connected together at one end. This would constitute a series element for which impedance would be relatively low at the fundamental frequency. As those skilled in the art would readily understand, by selecting the length of these transmission lines appropriately, typically at ¼ wave length of the frequency desired not to be absorbed, an appropriate element is created. In this fashion the embodiments shown in FIGS. 5 and 6 would act to absorb energy at all frequencies other than those for which the specific length of transmission line was effectively about an odd multiple of a quarter wave length.

Figure 7:
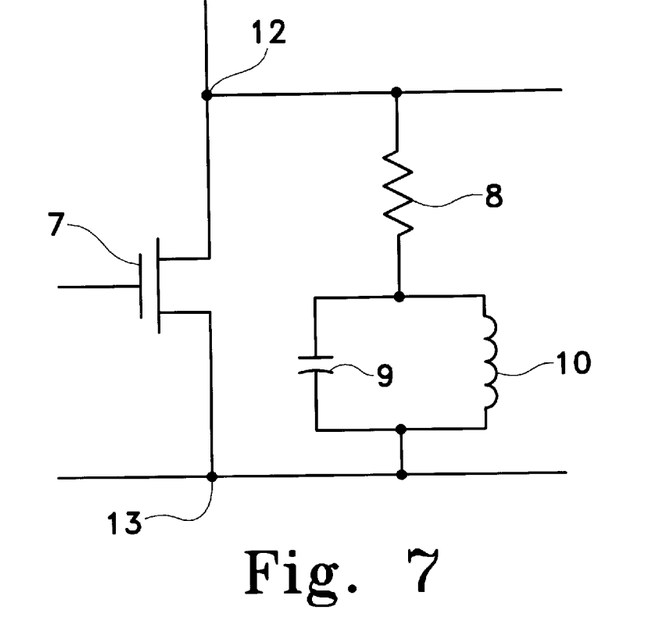
FIG. 7 is a circuit diagram of a switch element embodiment showing an element similar to that shown in FIG. 4 across two connections of the switch.
Figure 8:
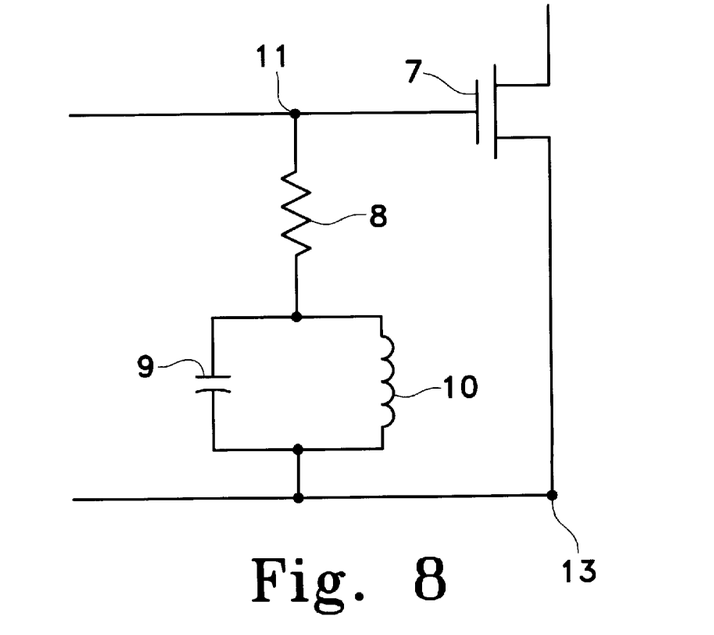
FIG. 8 is a circuit diagram of a switch element embodiment showing an element similar to that shown in FIG. 3 across two different connections of the switch.

Referring to FIGS. 7 and 8 it can be easily understood that stabilizing element (6) may also be implemented through the connection of circuit elements across primary switching element (7) within switch-mode power supply (1). As those skilled in the art readily understand, such primary switching elements involve a control connection (11), an output connection (12), and a common connection (13). By connecting stabilizing element (6) across control connection (11) and output connection (12) as show in FIG. 7 or alternatively across control connection (11) and common connection (13), stabilizing element (6) may accomplish its goal of absorbing undesired energy at primary switching element (7). As can be seen in comparing FIGS. 7 and 8, the actual circuit components utilized and their connections for stabilizing element (6) may take a variety of forms. As shown in FIG. 7, the connections are designed similar to the parallel element embodiment shown in FIG. 3. Naturally, other connections and other circuit designs could be achieved. All that is required is that they act to absorb the energy at the undesired frequencies.

Figure 9:
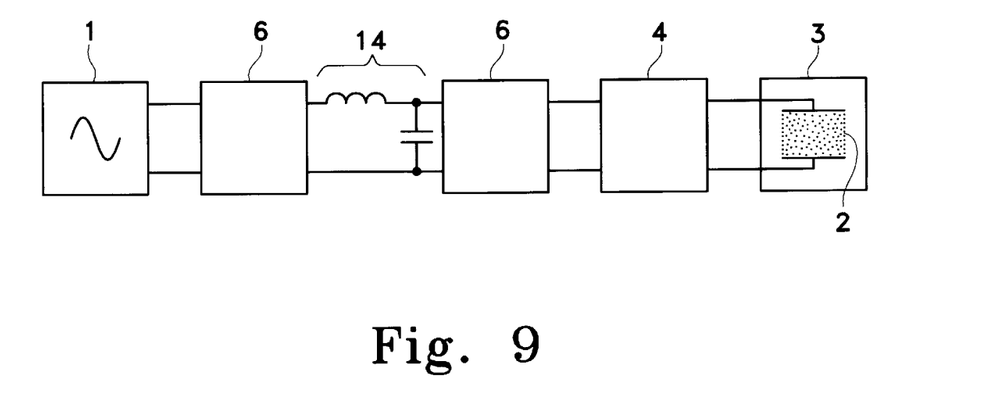
FIG. 9 is a schematic diagram of a processing system slowing the utilization of two stabilizing elements and filter as a means for changing phase connected between the two elements.

Referring to FIG. 9, it can be seen that more than one stabilizing element (6) may be utilized as well. Naturally these stabilizing elements (6) could be connected at any point within the system so long as they achieve the goal of absorbing the energy without allowing it to affect primary switching element (7). In conditions where the undesired energy originates at the plasma, the absorption might occur prior to affecting primary switching element (7). More than one stabilizing element (6) could also be connected in series to each other to absorb energies at differing frequencies. Additionally, any combination of series, parallel or circuit elements connected across primary switching elements (7) could be utilized as those skilled in the art would readily understand. As shown in FIG. 9, the two stabilizing elements (6) may have connected between them some phase change element. As show this element is actually filter (14) by utilizing some means for changing the phase or even more narrowly transforming the impedance along transmission line (5), two or more stabilizing elements (6) will achieve proper absorption of all undesired energy across more varied conditions. As mentioned earlier, stabilizing element (6) should be tuned to have either a relatively low or a relatively high impedance at the fundamental frequency depending upon whether stabilizing element (6) is presented in either a parallel or series fashion. As an example, for the parallel embodiment, it may also be selected so that it only has relatively high impedance of at least one other frequency. In such an application a minimum of energy would be absorbed, however, the problematic frequency (for instance, the second harmonic) would be absorbed to overcome the undesired ejects with minimum impact upon the amount of energy absorbed. The frequency selected and the various parameters chosen could naturally be varied according to the specific application involved.

The foregoing discussion and the claims which follow describe the preferred embodiments of the present invention. Particularly with respect to the claims, it should be understood that changes may be made, combinations created, and elements varied without departing from the essence of the invention. In this regard, it is intended that such changes would still fall within the scope or the present invention. It simply is not practical to describe and claim all possible revisions to the present invention which may be accomplished. To the extent such revisions utilize the essence of the present invention, each would naturally fall within the breadth of protection encompassed by this patent. This is particularly true for the present invention since its basic concepts and understandings are fundamental in nature and can be broadly applied.

We claim:

1. A method of stably delivering power to a plasma through an alternating signal comprising the steps of:
   a. generating an alternating signal at a fundamental frequency by a switch-mode power supply;
   b. transmitting said alternating signal into the plasma; while
   c. affirmatively absorbing energy at substantially other than the fundamental frequency by electrical circuitry.

2. A method of stably delivering power to a processing plasma through an alternating signal as described in claim 1 wherein said switch-mode power supply has at least one primary switching element and wherein said step of substantially absorbing energy at other than the fundamental frequency occurs prior to allowing said energy to affect said primary switching element.

3. A method of stably delivering power to a processing plasma through an alternating signal as described in claim 1 wherein said switch-mode power supply has at least one primary switching element and wherein said step of substantially absorbing energy at other than the fundamental frequency is accomplished at said primary switching element.

4. A method of stably delivering power to a plasma through an alternating signal as described in claim 1 wherein said step of transmitting said power to said plasma is accomplished by a transmission line and wherein said step of substantially absorbing energy at other than the fundamental frequency is accomplished on said transmission line.

5. A method of stably delivering power to a plasma through an alternating signal as described in claim 4 wherein said step of substantially absorbing energy at other than the fundamental frequency comprises the step of subjecting said power transmission to more than one energy absorption element.

6. A method of stably delivering power to a plasma through an alternating signal as described in claim 5 wherein said step of substantially absorbing energy at other than the fundamental frequency further comprises the step of changing the phase of said alternating signal between at least two energy absorption elements.

7. A method of stably delivering power to a plasma through an alternating signal as described in claim 1 wherein said step of substantially absorbing energy at other than the fundamental frequency comprises the step of utilizing a tuned circuit element.

8. A method of stably delivering power to a processing plasma through an alternating signal as described in claim 7 wherein said tuned circuit element has high impedance at said fundamental frequency.

9. A method of stably delivering power to a processing plasma through an alternating signal as described in claim 8 wherein said tuned circuit element has relatively low impedance at least one other frequency.

10. A method of stably delivering power to a processing plasma through an alternating signal as described in claim 8 wherein said tuned circuit element has relatively low impedance at the second harmonic.

11. A method of stably delivering power to a plasma through an alternating signal as described in claim 1 wherein said step of substantially absorbing energy at other than the fundamental frequency comprises the step of subjecting said alternating signal to more than one energy absorption element.

12. A method of stably delivering power to a plasma through an alternating signal as described in claim 11 wherein said step of substantially absorbing energy at other than the fundamental frequency further comprises the step of changing the phase of said alternating signal between at least two energy absorption elements.

13. A circuit for delivering power to a plasma through an alternating signal comprising:
   a. a switch-mode power supply capable of generating an alternating power signal at a fundamental frequency;
   b. a transmission line which transmits said alternating power signal into the plasma; and
   c. at least one energy absorption element which affirmatively absorbs energy at substantially other than the fundamental frequency.

14. A circuit for delivering power to a processing plasma through an alternating signal as described in claim 13 wherein said tuned circuit element has high impedance at said fundamental frequency.

15. A circuit for delivering power to a processing plasma through an alternating signal as described in claim 14 wherein said tuned circuit element has relatively low impedance at at least one other frequency.

16. A circuit for delivering power to a processing plasma through, an alternating signal as described in claim 14 wherein said tuned circuit element has relatively low impedance at the second harmonic.

17. A circuit for delivering power to a plasma through an alternating signal as described in claim 13 and further comprising a second energy absorption element that substantially absorbs energy at other than the fundamental frequency.

18. A circuit for delivering power to a plasma through an alternating signal as described in claim 17 and further comprising at least one phase change element wherein said phase change element is connected between said energy absorption element and said second energy absorption element.

19. A method of stably delivering power to a plasma through an alternating signal as described in claim 3 wherein said primary switching element has a common connection, an output connection, and a control connection and wherein said step of substantially absorbing energy reflected back to said switch-mode power supply at other than the fundamental frequency is accomplished by a circuit element connected across said control connection and said common connection.

20. A method of stably delivering power to a plasma through an alternating signal as described in claim 3 wherein said primary switching element has a common connection, an output connection, and a control connection and wherein said step of substantially absorbing energy reflected back to said switch-mode power supply at other than the fundamental frequency is accomplished by a circuit element connected across said output connection and said common connection.

21. A method of stably delivering power to a plasma through an alternating signal as described in claim 3 wherein said step of substantially absorbing energy at other than the fundamental frequency at said switch is accomplished by utilizing a resistor connected in series with a capacitor and an inductor where the capacitor and inductor are connected in parallel.

22. A method of stably delivering power to a plasma through an alternating signal as described in claim 3 wherein said step of substantially absorbing energy at other than the fundamental frequency at said switch is accomplished by utilizing a resistor connected in parallel with a capacitor and an inductor where the capacitor and inductor are connected in series.

23. A method of stably delivering power to a plasma through an alternating signal as described in claim 4 wherein said step of absorbing energy comprises utilizing a resistor connected in series with a capacitor and an inductor where the capacitor and inductor are connected in parallel.

24. A method of stably delivering power to a plasma through an alternating signal as described in claim 6 wherein said step of absorbing energy comprises utilizing a resistor connected in parallel with a capacitor and an inductor where the capacitor and inductor are connected in series.

25. A method of stably delivering power to a plasma through an alternating signal as described in claim 4 wherein said step of absorbing energy comprises utilizing a specific length of transmission line having two conducting elements connected together at one end and a resistor connected in series with one of said conducting elements.

26. A method of stably delivering power to a plasma through an alternating signal as described in claim 4 wherein said step of absorbing energy comprises utilizing a specific length of transmission line having two conducting elements unconnected at one end and a resistor connected across said specific length of transmission line at its other end.

27. A method of stably delivering power to a plasma through an alternating signal as described in claim 1 wherein said step of generating the alternating power signal comprises the step of utilizing a power amplifier in class C operation and having a relatively short active region.

28. A method of stably delivering power to a plasma through an alternating signal as described in claim 1 wherein said step of generating the alternating power signal comprises the step of utilizing a power amplifier in class D operation.

29. A method of stably delivering power to a plasma through an alternating signal as described in claim 1 wherein said step of generating the alternating power signal comprises the step of utilizing a power amplifier in class E operation.

30. A method of stably delivering power to a plasma through an alternating signal as described in claim 1 wherein said step of generating the alternating power signal comprises the step of utilizing a power amplifier in class AE operation.

31. A method of stably delivering power to a plasma through an alternating signal as described in claim 10 wherein said step of generating the alternating power signal comprises the step of utilizing a power amplifier in class C operation and having a relatively short active region.

32. A method of stably delivering power to a plasma through an alternating signal as described in claim 10 wherein said step of generating the alternating power signal comprises the step of utilizing a power amplifier in class D operation.

33. A method of stably delivering power to a plasma through an alternating signal as described in claim 10 wherein said step of generating the alternating power signal comprises the step of utilizing a power amplifier in class E operation.

34. A method of stably delivering power to a plasma through an alternating signal as described in claim 10 wherein said step of generating the alternating power signal comprises the step of utilizing a power amplifier in class AE operation.

35. A circuit for delivering power to a plasma through an alternating signal as described in claim 13 wherein said energy absorbing element comprises a resistor connected in series with a capacitor and an inductor where the capacitor and inductor are connected in parallel.

36. A circuit for delivering power to a plasma through an alternating signal as described in claim 13 wherein said energy absorbing element comprises a resistor connected in parallel with a capacitor and an inductor where the capacitor and inductor are connected in series.

37. A circuit for delivering power to a plasma through an alternating signal as described in claim 13 wherein said energy absorbing element comprises a specific length of transmission line having two conducting elements connected together at one end and a resistor connected in series with one of said conducting elements.

38. A circuit for delivering power to a plasma through an alternating signal as described in claim 13 wherein said energy absorbing element comprises a specific length of transmission line having two conducting elements unconnected at one end and a resistor connected across said specific length of transmission line at its other end.

39. A circuit for delivering power to a plasma through an alternating signal as described in claim 13 wherein said switch-mode power supply has a primary switching element having a common connection, an output connection, and a control connection and wherein said energy absorption element which absorbs energy at other than the fundamental frequency comprises a circuit element connected across said control connection and said common connection.

40. A circuit for delivering power to a plasma through an alternating signal as described in claim 13 wherein said switch-mode power supply has a primary switching element having a common connection, an output connection, and a control connection and wherein said energy absorption element which absorbs energy at other than the fundamental frequency comprises a circuit element connected across said output connection and said common connection.

41. A circuit for delivering power to a plasma through an alternating signal as described in claim 13 wherein said switch-mode power supply comprises a power amplifier in class C operation and having a relatively short active region.

42. A circuit for delivering power to a plasma through an alternating signal as described in claim 13 wherein said switch-mode power supply comprises a power amplifier in class D operation.

43. A circuit for delivering power to a plasma through an alternating signal as described in claim 13 wherein said switch-mode power supply comprises a power amplifier in class E operation.

44. A circuit for delivering power to a plasma through an alternating signal as described in claim 13 wherein said switch-mode power supply comprises a power amplifier in class AE operation.

45. A circuit for delivering power to a plasma through an alternating signal as described in claim 18 wherein said switch-mode power supply comprises a power amplifier in class C operation and having a relatively short active region.

46. A circuit for delivering power to a plasma through an alternating signal as described in claim 18 wherein said switch-mode power supply comprises a power amplifier in class D operation.

47. A circuit for delivering power to a plasma through an alternating signal as described in claim 18 wherein said switch-mode power supply comprises a power amplifier in class E operation.

48. A circuit for delivering power to a plasma through an alternating signal as described in claim 18 wherein said switch-mode power supply comprises a power amplifier in class AE operation.

49. A circuit for delivering power to a plasma through an alternating signal as described in claim 13 wherein said energy absorption element comprises a tuned circuit element.

* * * * *